US008663446B2

(12) United States Patent  
Chen

(10) Patent No.: US 8,663,446 B2  
(45) Date of Patent: Mar. 4, 2014

(54) ELECTROCHEMICAL-CODEPOSITION METHODS FOR FORMING CARBON NANOTUBE REINFORCED METAL COMPOSITES

(75) Inventor: Quanfang Chen, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 754 days.

(21) Appl. No.: 12/693,240

(22) Filed: Jan. 25, 2010

(65) Prior Publication Data

US 2010/0122910 A1  May 20, 2010

Related U.S. Application Data

(63) Continuation-in-part of application No. 11/437,180, filed on May 19, 2006, now Pat. No. 7,651,766.

(60) Provisional application No. 60/683,227, filed on May 20, 2005.

(51) Int. Cl.  
*C25D 15/00* (2006.01)

(52) U.S. Cl.  
USPC .................................................. 205/109

(58) Field of Classification Search  
USPC ........................................................ 205/109  
See application file for complete search history.

(56) References Cited

U.S. PATENT DOCUMENTS

| 7,365,100 | B2* | 4/2008 | Kuper et al. | 516/32 |
| 7,959,830 | B2* | 6/2011 | Jin | 252/500 |
| 2004/0040834 | A1* | 3/2004 | Smalley et al. | 204/164 |
| 2005/0098437 | A1* | 5/2005 | Shiepe | 205/109 |
| 2006/0021877 | A1* | 2/2006 | Ichiki et al. | 205/74 |
| 2007/0199826 | A1* | 8/2007 | Son et al. | 205/238 |
| 2008/0299374 | A1 | 12/2008 | Choi et al. | |
| 2009/0001325 | A1 | 1/2009 | Huo et al. | |

OTHER PUBLICATIONS

Chen et al. Electrodeposited nickel composites containign carbon nanotubes. 2002. Surface and Coating Technology 155. pp. 274-278.*

\* cited by examiner

*Primary Examiner* — Nicholas A Smith  
*Assistant Examiner* — Ciel Thomas  
(74) *Attorney, Agent, or Firm* — Jetter & Associates, P.A.

(57) ABSTRACT

An electrochemical-codeposition method for forming a carbon nanotube (CNT) reinforced metal nanocomposite includes providing a reaction vessel having an anode and a cathode and a plating solution therein, where the plating solution includes at least one acid, at least one surfactant, a plurality of CNTs, and a plurality of metal cations that include at least one metal. The plating solution has a pH between 2 and 4.5 and at least a portion of the plurality of CNTs are positively charged CNTs in the plating solution. A power supply is connected between the anode and cathode. The positively charged CNTs and metal cations are both electrochemically-codeposited onto the cathode to form the nanocomposite, wherein the metal provides a continuous metal phase for the nanocomposite.

14 Claims, 6 Drawing Sheets

Fig. 3: (A) Sketch of flow streamline alignment, (B) is an actual SEM picture of aligned SWCNT in the Cu matrix.

Table 1

| Tested electric resistivity of Cu/SWNT composite sample (thickness=22 μm) | | | |
|---|---|---|---|
| Measured point | Restivity (μΩ-cm) | Rs (Ω/□) | V/I (Ω) |
| Point 1 | 1.1858 | 0.000539 | 0.000118 |
| Point 2 | 1.2408 | 0.000564 | 0.000124 |
| Point 3 | 1.2342 | 0.000561 | 0.000123 |
| Average | *1.2203* | *0.000555* | *0.000122* |
| Tested electric resistivity of electroplated pure copper (thickness=10.5 μm) | | | |
| Measured point | Restivity (μΩ-cm) | Rs (Ω/□) | V/I (Ω) |
| Point 1 | 1.6695 | 0.00159 | 0.000352 |
| Point 2 | 1.785 | 0.00170 | 0.000376 |
| Point 3 | 1.7115 | 0.00163 | 0.000360 |
| Average | *1.7220* | *0.00164* | *0.000363* |

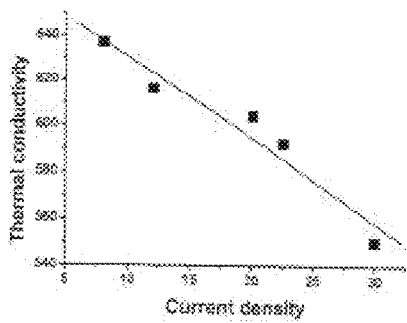
FIG. 5A
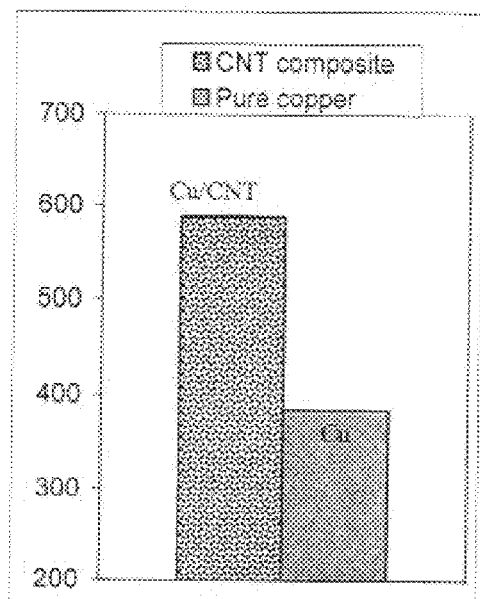
FIG. 5B
FIG. 5

ELECTROCHEMICAL-CODEPOSITION METHODS FOR FORMING CARBON NANOTUBE REINFORCED METAL COMPOSITES

CROSS-REFERENCE TO RELATED APPLICATIONS

This application is a continuation-in-part (CIP) of U.S. non-provisional patent application Ser. No. 11/437,180 entitled "CARBON NANOTUBE REINFORCED METAL COMPOSITES" filed on May 19, 2006, now U.S. Pat. No. 7,651,766 issued Jan. 26, 2010, which claims the benefit of U.S. Provisional Patent Application Ser. No. 60/683,227 filed on May 20, 2005, the entirety of both of which is incorporated herein by reference.

FIELD

Disclosed embodiments relate to carbon nanotube reinforced metal composite materials and electrochemical deposition-based methods for making the same.

BACKGROUND

There is a never ending search for improved materials. Many of these improved materials are composite materials. Composites are formed when various distinct materials are engineered together to create a new material. The idea is to take best advantage of the strengths of each component material, while minimizing their weaknesses. Composites may be engineered with unique physical properties to suit very distinct applications.

Carbon nanotube (CNT) composites have recently received a lot of attention. A CNT is essentially a graphite sheet folded into a tubular shape. This structure retains the mechanical strength of the sheet axial (in-plane) to the orientation of the tube, but is weak in the lateral direction. CNTs also provide high in-plane electrical conductivity as well as high in-plane thermal conductivity. Recent efforts in forming CNT composites generally involve blending
CNTs into a polymer matrix, much like a fiberglass composite.

SUMMARY

Disclosed embodiments include electrochemical-codeposition methods for forming CNT reinforced metal nanocomposites. The methods include providing a reaction vessel having an anode and a cathode and a plating solution therein that includes at least one acid, surfactant, a plurality of CNTs, and a plurality of metal cations that include at least one metal. The plating solution has a pH between 2 and 4.5 and at least a portion of the plurality of CNTs are positively charged CNTs in the plating solution. A power supply is connected between the anode and cathode. The positively charged CNTs and metal cations are both electrochemically-codeposited onto the cathode to form the nanocomposite, wherein the metal provides a continuous metal phase for the nanocomposite. The continuous metal phase generally extends throughout substantially an entire volume of the nanocomposite.

In one embodiment the plurality of CNTs are treated with surfactant before placement into the plating solution. In one embodiment, the pH is maintained between 2 and 4, and in another embodiment, the pH value during electrochemical-codeposition is maintained at a level of 2 to 3.5.

The metal can comprise a variety of metals including, but not limited to, copper, cobalt, chromium, tungsten, silver, nickel and gold, or alloys thereof. Using any of these metals, the nanocomposite has unexpectedly been found to provide a 25° C. bulk electrical conductivity that is least 20% greater than a 25° C. bulk electrical conductivity of the metal. In one particular embodiment the metal comprises copper and the 25° C. bulk electrical conductivity of the nanocomposite is at least 40% greater than the 25° C. bulk electrical conductivity of copper. In the copper embodiment the nanocomposite can provide a coefficient of thermal expansion in the range from 3 to $6 \times 10^{-6}$/K in the temperature range from 25 to 150° C.

In a typical embodiment, the concentration of CNTs in the plating solution is at a level low enough so that the plurality of CNTs are highly dispersed in the plating solution. In such embodiments, a volume fraction of CNTs is from 1 to 30 vol. % of the nanocomposite. In one embodiment, the CNTs comprise at least 95 vol. % single wall nanotubes (SWNTS).

Other embodiments disclose CNT reinforced metal nanocomposite material which comprises a continuous metal phase, and a plurality of CNTs dispersed in the continuous metal phase. The metal phase extends throughout substantially an entire thickness of the nanocomposite material. As used herein, the phrase "throughout substantially an entire thickness of the nanocomposite material" refers to at least the majority (51%) of the volume of the nanocomposite material including metal or metal alloy. In a typical embodiment, essentially the entire volume of the bulk material (e.g. at least 95%, such as >99%) includes the metal. CNT reinforced metal nanocomposites disclosed herein provide thermal conductivity and electrical conductivity which are both generally significantly higher than the pure metal continuous phase material, and a tailorable coefficient of thermal expansion obtainable through changing the percentage of CNTs in the nanocomposite. Moreover, the mechanical strength of metal nanocomposites according to a disclosed embodiment have been found to be generally at least 2 to 3 times higher as compared to the pure metal or metal alloy material. Therefore, nanocomposites according to disclosed embodiments are multifunctional.

Parameters of nanocomposites disclosed herein are all generally isotropic, including, but not limited to thermal conductivity, electrical conductivity, coefficient of thermal expansion, and mechanical strength. However, anisotropic parameters can be obtained using the invention, such as in the case of nanocomposites fabricated with aligned CNTs, or those of single/bundle CNT coated with a metal layer.

In one embodiment he continuous metal phase comprises copper. In the copper embodiment, the CNT reinforced metal nanocomposite material provides a 25° C. electrical conductivity and bulk thermal conductivity that are both generally at least 40% greater than pure copper. The CNT reinforced Cu nanocomposite material can provide a coefficient of thermal expansion in the range from 3 to $6 \times 10^{-6}$/K in the temperature range from 25 to 150° C.

The CNTs can consist essentially of single wall nanotubes (SWNTs), such as at least 95%. The volume fraction of the plurality of CNTs is generally from 0.1 to 60% of the nanocomposite, such as 0.5%, 1%, 5%, 10%, 15%, 20%, 25%, 30%, 35%, 40%, 45%, 50%, or 55%. In one embodiment, the volume fraction of CNTs comprises 5% to 30 vol. % of the nanocomposite. In one embodiment, the CNTs are preferentially aligned in the composite in a direction generally orthogonal a direction of the thickness of the nanocomposite.

BRIEF DESCRIPTION OF THE DRAWINGS

A fuller understanding of the disclosed embodiments and the features and benefits thereof will be obtained upon review of the following detailed description together with the accompanying drawings, in which:

FIG. 3(A) is a sketch of SWNTs preferentially aligned in a particular direction in a Cu comprising electrolyte solution while FIG. 3(B) is a scanned SEM photograph which shows a nanocomposite according to a disclosed embodiment a disclosed embodiment in which SWNTs are preferentially aligned in a particular direction in a Cu comprising continuous phase (matrix), thus demonstrating that CNTs can be aligned within a metal matrix.

FIG. 5(A) shows the measured room temperature bulk thermal conductivity for an exemplary electroformed SWNT/Cu nanocomposite versus the deposition current density (mA/cm$^2$) used to form the SWNT/Cu nanocomposite. FIG. 5(B) shows the bulk thermal conductivity of a SWNT/Cu nanocomposite according to a disclosed embodiment as compared to the bulk thermal conductivity of pure copper (385 W/m·K).

DETAILED DESCRIPTION

Figure 1:
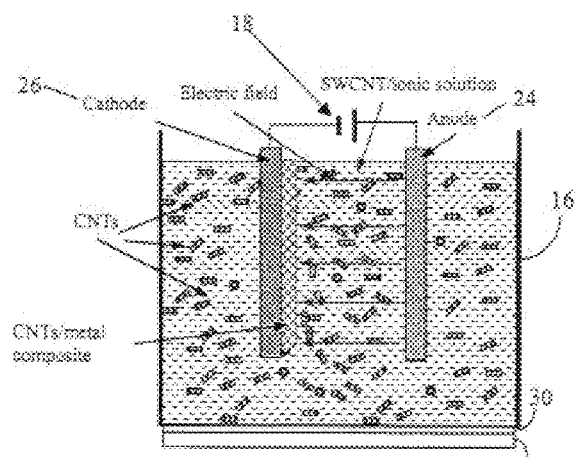
FIG. 1 shows a schematic of an exemplary electrochemical-codeposition apparatus for forming nanocomposites disclosed herein.

The disclosed embodiments are more particularly described in the following description and examples that are intended to be illustrative only since numerous modifications and variations therein will be apparent to those skilled in the art. As used in the specification and in the claims, the singular form "a," "an," and "the" may include plural referents unless the context clearly dictates otherwise. Also, as used in the specification and in the claims, the term "comprising" may include the embodiments "consisting of" and "consisting essentially of".

Disclosed embodiments include electrochemical-codeposition methods for forming CNT reinforced metal nanocomposites. A reaction vessel is provided having an anode and a cathode and a plating solution therein, where the plating solution comprises at least one acid, at least one surfactant, a plurality of CNTs, and a plurality of metal cations that include at least one metal. The plating solution has a pH between 2 and 4.5 and at least a portion of the plurality of CNTs are positively charged CNTs in the plating solution. A power supply is connected between the anode and cathode. The positively charged CNTs and metal cations are both electrochemically-codeposited onto the cathode to form the nanocomposite, wherein the metal provides a continuous metal phase for the nanocomposite.

Methods disclosed herein advantageously can be performed at or near room temperature, such as less than or equal to about 50° C., and are thus compatible with a wide variety of processes and associated materials. An exemplary process capable of being scaled for large area substrates and codeposition on multiple substrates simultaneously is provided in the Examples.

Experimental results from experiments performed by the Inventor have verified that when the pH value of the plating solution is from 2-4, CNTs are easily deposited by the applied electric field onto the cathode, indicating that a significant portion of the CNTs become positively charged. However, when pH value is greater than about 5, the Inventor has found very few, if any, CNTs are deposited, likely because of the inventor's finding that few if any CNTs become positively charged in the electrolyte solution at pH values approaching 5, or more.

Acid treatment of CNTs (for example using nitric acid) is known to lead to oxidation of the CNT outer walls, causing disruption of the conjugated electronic structure of the CNTs and sometimes shortening of the CNTs. As a result, the electrical conductivity and the aspect ratios of CNTs exposed to acids such as nitric acid tend to significantly decrease. In the pH range from 2 to 4.5 the Inventor has discovered that the surfactant(s) protects the CNTs from surface damage due to the acid, particularly when the CNTs are pretreated in surfactant, as evidenced by the high bulk electrical conductivity values of the resulting nanocomposite (e.g. >20% higher than the pure metal used in the nanocomposite) described herein.

CNT reinforced metal nanocomposite material disclosed herein comprise a continuous metal phase, and a plurality of CNT dispersed in the continuous metal phase. The metal phase extends throughout substantially an entire thickness, and generally the entire thickness, of the nanocomposite material. The plurality of CNTs are generally uniformly covered by the continuous metal phase. In one embodiment, the CNTs are preferentially aligned in the continuous metal phase, such as generally along a given direction. The nanocomposite is generally exclusive of any material other than the metal or metal alloy and the CNTs.

CNT reinforced metal nanocomposites as disclosed herein provide thermal conductivity, electrical conductivity and tensile strength all generally significantly higher than the pure metal continuous phase material. The bulk electrical conductivity being at least 20% greater than a 25° C. bulk electrical conductivity of the metal in the nanocomposite is a highly unexpected and highly advantageous result (especially for speeding of integrated circuits (ICs)) because metals generally provide 25° C. bulk electrical conductivities that are several orders of magnitude higher than the bulk electrical conductivity of CNTs. The well known law of mixing is generally applicable to the electrical conductivity of composite materials, such as formed from Hot Isostatic Pressing (HIP) processes, that results in the bulk electrical conductivity of the nanocomposite being between the bulk electrical conductivity of the CNTs and the bulk electrical conductivity of the metal, with the bulk electrical conductivity of the composite material decreasing with increasing CNT loading.

Although the electrical conductivity CNTs can be significantly higher (by some estimates, an order of magnitude higher) than that of most metals, this refers only to the in-plane (along the graphite-like layer) electrical conductivity of a single metallic CNT. Therefore, although for a single metallic CNT the 25° C. electrically conductivity in the in-plane direction may be higher than some ordinary metals, but is still not higher than copper, since in the out-of-plane direction (between CNTs) is a significantly lower electrically conductivity path, and non-metallic CNTs are always present in CNT samples comprising a plurality of CNTs, the bulk electrical conductivity of CNTs will always be lower than that of metals.

CNT reinforced metal nanocomposites according to disclosed embodiments also provide tailorable coefficient of thermal expansion (CTE) through variation of the composition. The tailorable CTE can be designed to match the CTE for a variety of materials of interest, including most semiconductors and electrically insulating (dielectric) substrates.

Referring now to FIG. 1, a schematic representation of an exemplary electrochemical codeposition apparatus for producing the CNT nanocomposites disclosed herein is shown. As noted above, the deposition can be performed at low temperatures, and thus the electrochemical codeposition method is highly versatile. For example, electrochemical codeposition according to a disclosed embodiments can be integrated with many IC fabrication processes including damascene processes used in state-of-the-art IC fabrication processes to form electrically conductive interconnect layers that connect together a large number of active circuit elements that generally include a plurality of transistors, diodes, capacitors, and resistors, as well as to form other electrically conductive layers (e.g. contacts and/or metal gates). Another advantage of the electrochemical co-deposition process disclosed herein is that CNTs are not measurably degraded by the inventive electrochemical codeposition process as described above and better interfacial bonding is obtained, which can be described as electrostatic bonding, due to the low temperature and better wetting characteristics.

CNTs, a source of metal ions (e.g. metal salt), and an electrolyte solution are provided in reaction vessel 16, which is generally made of glass or ceramic. A power supply 18 with an ammeter and voltmeter (not shown) is connected between the anode 24 and cathode 26. The CNT metal nanocomposite is shown forming on the cathode 26. Agitation of the liquid can be provided by a magnetic stirrer 28 separated from the liquid by a spacer 30. A reference electrode (not shown) can be provided to monitor the electrochemical activity.

As described above, in a typical embodiment, the CNTs are pretreated with one or more surfactants. A variety of surfactants can be used. The surfactant can be a non-ionic, anionic, cationic or a zwitterionic surfactant. Exemplary surfactants are cetyl trimethyl ammonium bromide (CTAB; a cationic specie) and octyl trimethylammonium bromide (OTAB; another cationic specie). This pre-treatment positively charges the CNT in the electrolyte comprising solution and also limits flocculation of the CNTs out of the solution. Since the metal ions are generally positively charged as well, the codeposition is realized with metallic ions (such as $Cu^{+2}$) and CNT both electrodepositing at the cathode where they are each electrochemically reduced.

In one embodiment, the electrolyte solution includes $CuSO_4$ as the metal ion source, $H_2SO_4$ as the electrolyte source, SWNTs and CTAB, and other additives for reducing the stress and increasing the brightness. The pH value is generally maintained at a level of 2-4.5 to provide a high level of CNT dispersion. The concentration of CNTs in the electrolyte solution is generally in the range from 0.5 vol. % to 80 vol. %. A CNT concentration below about 30 vol. % together with a surfactant in the electrolyte solution has been found allow highly dispersed CNTS.

The deposition rate is readily controllable via the current control as monitored by a suitable ammeter. The deposition rate can generally be as low as 1 μm/hour or generally as high as 1 μm/minute.

A variety of anode and cathode materials can be used for the electrochemical co-deposition. For example, the cathode for the codeposition can be selected from metallic substrates, such as copper plate/sheet, other metals or metal alloys such as nickel, cobalt, chromium, tungsten, gold, and alloys/steels. The anode can be a metallic material to be co-deposited such as copper, or a noble and generally chemically inert metal, such as platinum.

Electrically non-conductive (i.e. dielectric) or semiconductor materials, such as silicon, silicon dioxide, silicon carbide, can be used as electrodes by depositing a metallic layer (seed layer) thereon. The seed layer is an electrical conductor, such as copper or nickel. Titanium or chromium are exemplary metals that can be used to increase the adhesion between the metallic seed layer and the non-metallic base material.

As compared to other metals, copper is provides relatively high electrical, high thermal conductivity, and low cost. The cost of fabrication of nanocomposites including copper as disclosed herein is expected to be comparable to conventional metal (e.g. Cu) electrochemical deposition. However, other metallic materials, including but not limited to silver, nickel, gold, or alloys thereof, can be also be used. More generally, any metal providable as a cation in solution and electrochemically reducible can be used. Based alone on electrical and thermal conductivity considerations, silver is generally a good choice as an alternative to copper. However, nanocomposites disclosed herein can also be based on, or include, electrically conductive polymers, such as polypyrrole, polyphenylene and polythiophene, and derivatives thereof.

In one embodiment, the CNTs in the nanocomposite consist essentially of SWNTs, such as at least 90 vol. %, or 95 vol. %, or more, such as 99 vol. %. SWNTs have been found to lead to higher electrical conductivity and tensile strength for the nanocomposite as compared MWNTs. However, when maximum electrical conductivity or tensile strength is not a requirement, MWNTs can be used, or mixtures of SWNTs along with a significant percentage (e.g. >10%) of MWNTs.

The overall amount of CNTs in the nanocomposite may vary, depending on the selected application. As noted above, the CNTs generally make up from 0.1 to 60% by volume of the nanocomposite, in some embodiments being about 10 to about 30 vol. %. The CNT density is about 1.33 $g/cm^3$. Therefore, more CNTs added would tend to reduce the density of the nanocomposite.

The high electrical and thermal conductivity, high tensile strength, and tailorable coefficient of thermal expansion (CTE) makes nanocomposites disclosed herein well suited for a variety of applications. Regarding thermal conductivity, thermal conductivity is known to be important in applications requiring dissipation of heat resulting from various applications. As noted above, the thermal conductivity of metal composites according to disclosed embodiments are significantly higher than the corresponding pure metal or metal alloy. Since the Cu/SWNT composites disclosed herein provide very high thermal conductivities, it is generally difficult to measure the thermal conductivity directly due to difficulties in measuring the small temperature drop required precisely enough. The Inventor has developed a micro-electro-mechanical setup to measure the thermal conductivity. The measured thermal conductivity of an exemplary CNT reinforced copper composite according to a disclosed embodiment was found to be about 640 W/m·K, or about 66% higher as compared to pure copper. However, significantly higher thermal conductivity from composites according to disclosed embodiments are expected to be obtainable.

Since the Cu/SWNT can be modeled as a metallic conductor, its thermal conductivity (K) can be determined with the Wiedemann and Franz law copied below, where σ. is the electrical conductivity, and T is the temperature in Kelvin:

$$K/\sigma T = L = (\lambda^2 k_B^2/3e^2) = 2.45 \times 10^{-8} \, W \cdot \Omega/K^2 \quad (1)$$

From the electrical resistivity measured with an exemplary Cu/SWNT composite using four-point probe ($1.22 \times 10^{-6}$ ohm-cm), the electrical conductivity is the reverse (inverse) of it in equation (1).

The effective CTE of Cu/S WNT nanocomposite (or more generally a metal/SWNT composite) can be estimated as follows:

$$\alpha_{com} = (\alpha_{CNT} E_{CNT} V_{CNT} + \alpha_{Cu} E_{Cu} V_{Cu})/(E_{CNT} V_{CNT} + E_{Cu} V_{Cu}) \quad (2)$$

Where E is the Young's modulus, V is the volume fraction, and a stands for CTE. Since CNT's Young's modulus is very high (about 1 TPa) and the CTE is negative in axial direction ($-1.6 \times 10^{-6}$/K), a tailorable CTE of the CNT/Cu composite can be realized using equation (2). For example, a volume portion of 23% of SWNT is calculated to achieve a CTE for the nanocomposite about the same as the CTE for SiC. Similarly, a volume fraction of 16% is calculated to match the CTE of GaAs ($5.9 \times 10^{-6}$/K).

The high electric conductivity plus matched CTE of the Cu/SWNT nanocomposite with the semiconductor (e.g. Si) has significant potential for power electronics (interconnect, packaging and assembling). Regarding integrated circuits including processors and memory circuits where speed is of high importance, the use of Cu for interconnect layers has already begun to replace Al alloys for 0.18 μm processes, and is expected to become common for 0.13 μm processes and below to permit that attainment of the desired processing speed. Because as noted above Cu/SWNT nanocomposites according to a disclosed embodiment generally provide bulk electrical conductivities of >40% higher as compared to Cu, Cu/SWNT nanocomposites according to disclosed embodiments are expected to replace Cu for applications for IC interconnect layers which Cu is currently used and was previously planned to be used for performance considerations alone. The improved CTE matching of Cu/SWNT nanocomposites according to a disclosed embodiment as compared to Cu provides another compelling reason to use Cu/SWNT nanocomposites according to a disclosed embodiment instead of Cu.

Applied to MEMS applications, good mechanical properties such as tensile strength and coefficient of thermal expansion are also important. Nanocomposites disclosed herein can provide improved thermal management for high power electronics (HPE) where ultra high thermal conductive materials for heat spreader/exchanger to maintain the semiconductor HPE temperature below certain value (e.g. 150° C. for high power amplifiers). Other heat spreader applications include those for high power lasers, high field magnets, and IC circuits, including heat spreaders for semiconductor packages.

Nanocomposites disclosed herein also provide high specific thermal conductivity, which is defined as the thermal conductivity divided by the density of the material. The resulting density of the nanocomposite has been found to largely depend on the volume fraction of CNT used, as well as the concentration of micro voids in the nanocomposite material. Microvoids form due to gas bubbles generated during the electrochemical-codeposition process described herein. It is generally desirable to limit the concentration of microvoids. The concentration of microvoids can be limited by controlling the deposition rate, with a lower deposition rate generally leading to a lower density of microvoids. However, in some applications, such as in space applications, where a low density is needed, a high concentration of microvoids may be desirable.

The density of the nanocomposite is generally about 85 to 98% of the density of metal continuous phase material, such as copper. Accordingly, the ratio of the specific thermal conductivity of composites disclosed herein to the underlying metal comprising the continuous phase is even higher than the corresponding bulk thermal conductivities. Specific thermal conductivity becomes important when the weight of an article is of importance.

Moreover, the mismatch of the coefficient of thermal expansion (CTE) between most semiconductors (4 to $6 \times 10^{-6}$/K) and the heat spreaders/exchangers can be minimized to a low level. It is expected that composites disclosed herein can provide a tailorable CTE to match the semiconductor from about 4 to about 10 ppm/K as needed. The CTE providable by a disclosed embodiments can be compared with the CTE of Cu of about 17 ppm/K. According, composites according to disclosed embodiments will experience little or no reliability impacting spalling that is known to be experienced by Cu layers on semiconductors.

Figure 9:
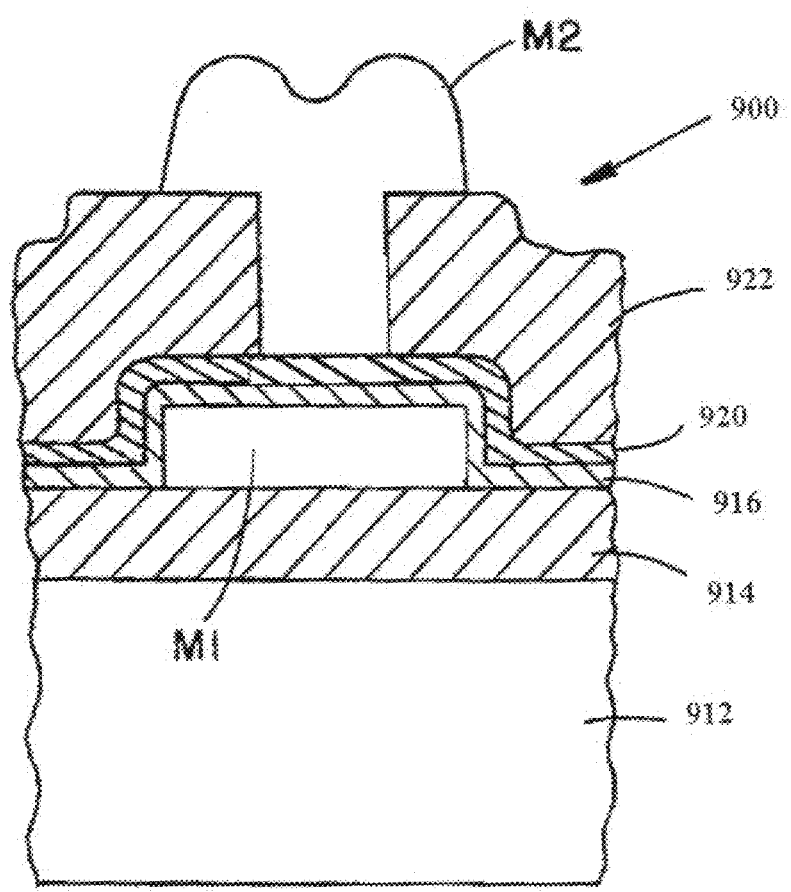
FIG. 9 is a sectional schematic view of a portion of a semiconducting article having metal interconnect layers according to a disclosed embodiment.

As noted above, nanocomposites according to disclosed embodiments can also provide improved metal interconnect layers for ICs. FIG. 9 described below discloses a semiconducting article having metal interconnect layers according to a disclosed embodiment.

Electrochemical codeposition can be performed to deposit nanocomposites on the wafer surface, such as on patterned damascene wafers on a plurality of wafers at a time. Among the challenges facing microelectronic in the push to greater device densities is electromigration of metal from the metal interconnect. This effect is exacerbated by the increasing electric fields, as individual device dimensions shrink. The ease with which species migration occurs is related to the atomic binding strength of the material. Bonds must be broken and reformed for atomic migration to occur. Carbon atoms comprising the CNT sidewalls are exceptionally tightly bound, requiring about 7 eV per atom to remove, compared to 1 to 3 eV for elemental metal materials. Moreover, the CNTs themselves are generally too large to migrate as a whole. Thus, electromigration of the carbon from the CNTs will be effectively non-existent, thus significantly improving the electromigration resistance of the nanocomposites disclosed herein.

Besides interconnects, semiconductor applications for disclosed nanocomposites include, but are not limited to, packaging such as wafer bumping and leadframes. One exemplary leadframe is the bumped double leadframes for power electronics.

Other applications for nanocomposites disclosed herein or a disclosed embodiment will benefit from the high electrical conductivity, high thermal conductivity and/or high mechanical (e.g. tensile) strength provided by nanocomposites disclosed herein. Other exemplary applications, include, but are not limited to thermal management, such as heat spreaders and heat exchangers, interface materials, spacecraft radiators, electric motors and generators, antennas, avionic enclosures and printed circuit board thermal planes, optoelectronic and microelectromechanical (MEMS) components and subsystems, fuel cells, and medical materials.

EXAMPLES

Disclosed embodiments are further illustrated by the following specific Examples, which should not be construed as limiting the scope or content of this Disclosure in any way.
Exemplary Process An exemplary electrolyte composition used to form CNT reinforced copper composites according to a disclosed embodiment comprised 250 g/L Copper Sulfate Pentahydrate Crystals ($CuSO_4 \cdot 5H_2O$), 40 mL/L sulfuric acid (concentration of 98%), 0.13 mL/L hydrochloric acid (concentration of 35%), 12.5 mL/L COPPER GLEAM CLX START-UP™, and 2 g/L SWNTs. All the chemicals except the COPPER GLEAM CLX START-UP™ were obtained from Fisher Scientific Inc (Fairlawn, N.J.). The latter was ordered from Think & Tinker, Ltd., (Palmer Lake, Colo.).

First, the SWNTs were dispersed in the copper electrolyte with surfactants. The surfactants including Sodium Dodecyl Sulfate (SDS), Triton X-100™ Pointe Scientific, Inc. Wetting Agent (Canton, Mich.), CTAB and OTAB were used as dispersants. Ultrasonic stifling was employed to break up the CNT aggregates. Uniform black dispersed solutions were obtained without stirring. The solutions can generally be kept for several days without aggregation for the maximum concentration of CNT of about 10 g/L. The pH of the plating solution was between about 3.4 and 3.8.

Next, electrochemical-codeposition was conducted to fabricate the nanocomposite using the above-mentioned solution. A square-shaped anode was used for the uniformity coverage opposite to the cathode substrate. The deposition was performed at room temperature and the current density was kept at 10 mA/cm². The deposition rate was about 13 μm/hour. This process is easily scalable to deposit on semiconductor wafers, including large area wafers, and for deposition on multiple such wafers simultaneously.

Figure 2:
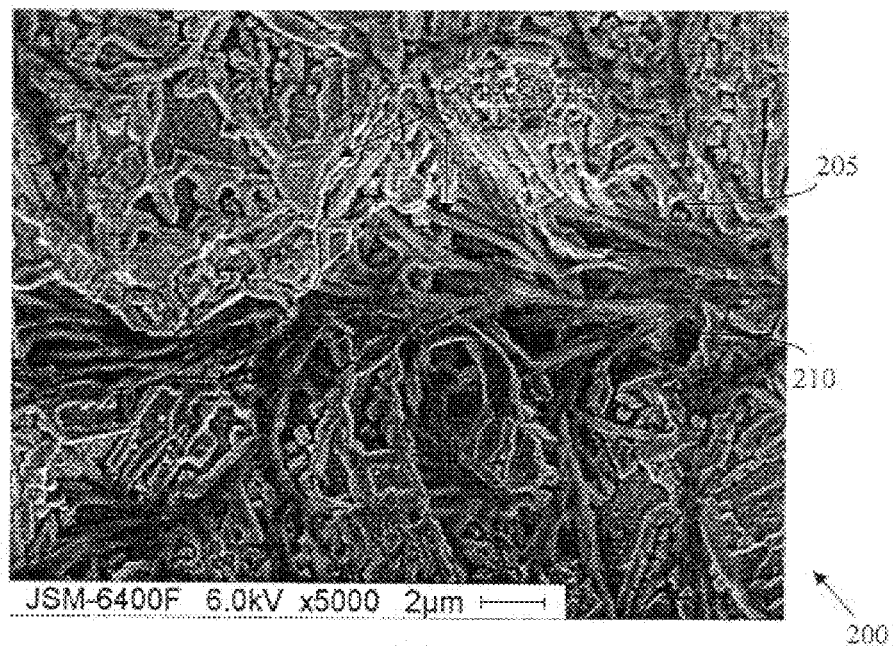
FIG. 2 is a scanned SEM image of an electrochemically-codeposited copper/SWNT nanocomposite. SWNTs can be seen to be covered uniformly by copper that forms the continuous phase shown.

CNT reinforced copper nanocomposites were formed using the electrochemical-codeposition process described above. FIG. 2 is a scanned SEM image of an electrochemically-codeposited copper/SWNT nanocomposite 200. SWNTs 205 can be seen to be covered uniformly by copper that forms the continuous phase 210. The SWNTs can be seen to be somewhat aligned in the Cu matrix. The uniformity in coverage with stiff and conductive copper better utilizes the properties of the SWNTs, as compared to conventional CNT polymer composites.

Figure 3:
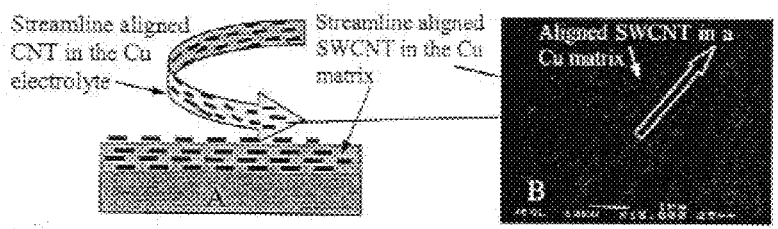

FIG. 3(A) is a sketch of SWNTs preferentially aligned in a particular direction in a Cu comprising electrolyte, while FIG. 3(B) is a scanned SEM photograph which shows a nanocomposite disclosed herein in which SWNTs are preferentially aligned in a particular direction in a Cu comprising continuous phase (matrix), thus demonstrating that CNTs can be preferentially aligned within the metal matrix.

Figure 4:
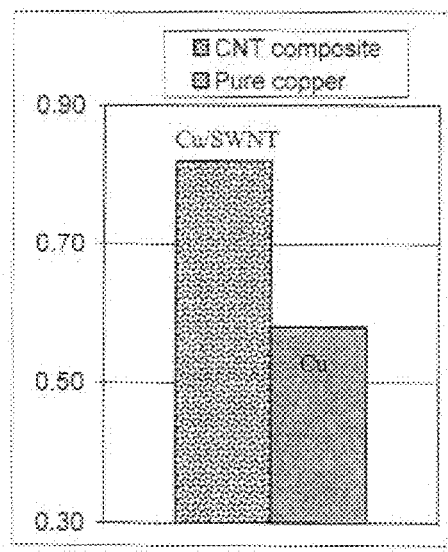
FIG. 4 shows the electrical conductivity ($\times 10^6$ Siemens) measured with a four-point probe on fabricated Cu/SWNT nanocomposite according to a disclosed embodiment and electrochemically deposited copper. The fabricated copper has a standard electrical conductivity (resistivity of $1.72 \times 10^{-6}$ ohm-cm), while the copper coated SWNT composite according to a disclosed embodiment was found to have much higher electrical conductivity as compared to copper (>40%), with a corresponding lower resistivity ($1.22 \times 10^{-6}$ ohm-cm). Table 1 provided shows the raw measured data used to compile the comparative plot provide.

FIG. 4 shows the electrical conductivity ($\times 10^6$ Siemens) measured with a four-point probe at room temperature on fabricated Cu/SWNT nanocomposite according to a disclosed embodiment and electrochemically deposited copper. The SWNT/copper composite was 10 μm thick and fabricated on a silicon wafer. Similarly, a 10 μm copper layer was prepared on different wafer using a otherwise equivalent electrodeposition process for a control. The measured room temperature resistance of the copper control sample was $1.72 \times 10^6$ ohm-cm, which is equivalent to the published resistivity value for copper, while the copper coated SWNT composite according to a disclosed embodiment was found to have much higher electrical conductivity (≥40% higher) as compared to copper, with a corresponding lower resistivity ($1.22 \times 10^{-6}$ ohm-cm), which is about 60% of the resistivity of pure copper. Table 1 provided shows the raw measured data used to compile the comparative plot provided.

It may be possible to further improve the electrical conductivity of the nanocomposite through improved interfacial bonding and better SWNT alignment during fabrication, as well the effects on electron transport. CNTs can be aligned using a flow orientation direction during the electrodeposition process, or by using a magnetic field during electrodeposition to orient the CNTs which generally become positively charged in the presence of surfactant.

Regarding thermal conductivity, as noted above, since the Cu/SWNT composite is a very good thermal conductor, it is difficult to measure the thermal conductivity directly, due to difficulties in measuring the temperature drop precisely. The measured thermal conductivity of an exemplary CNT/Cu composite according to a disclosed embodiment was found to be about 640 W/m·K, which is about 66% better than that of pure copper. Moreover, the thermal conductivity can be estimated by the Wiedemann and Franz's law (Equation 1 above). Using the electrical resistivity of the Cu/SWNT composite using a four-point probe ($1.22 \times 10^{-6}$ ohm-cm), the thermal conductivity is the reverse of it in the equation (1). The calculated thermal conductivity (K) of the nanocomposite using equation 1 is calculated to be 588 W/m·K. This value of thermal conductivity (K) for the nanocomposite is 53% greater than the thermal conductivity (K) of pure copper (385 W/m·K) as shown in FIG. 5(B).

It was found that thermal conductivity is a function of deposition current density (mA/cm²) used to form the SWNT/Cu nanocomposite FIG. 5(A) shows the measured room temperature bulk thermal conductivity for an exemplary electroformed SWNT/Cu nanocomposite versus the deposition current density (mA/cm²) used to form the SWNT/Cu nanocomposite. As the deposition current density is increased, the thermal conductivity is seen to increase in a nearly linear fashion.

Regarding mechanical characterizations, strength, toughness and coefficient of thermal expansion (CTE) are important properties for multifunctional materials. As noted above, CTE is important for thermal and electrical application in high power electronics (HPE) and VLSIC, as well as in high magnetic fields, due to the effect of mismatch of CTE between conductors and other substrates. For example, the CTE of copper is very high ($17.0 \times 10^{-6}$/K) and semiconductor's CTE is much smaller (SiC about $3.8 \times 10^{-6}$/K, GaAs about $5.9 \times 10^{-6}$/K). The effort in developing a CuMo alloy to reduce the CTE (CTE $5.8 \times 10^{-6}$/K) to the same order of semiconductors has resulted substantial decreased the thermal conductivity (181 W/m·K). Therefore, materials with matched CTE and high thermal and electrical conductivity are needed.

Figure 6:
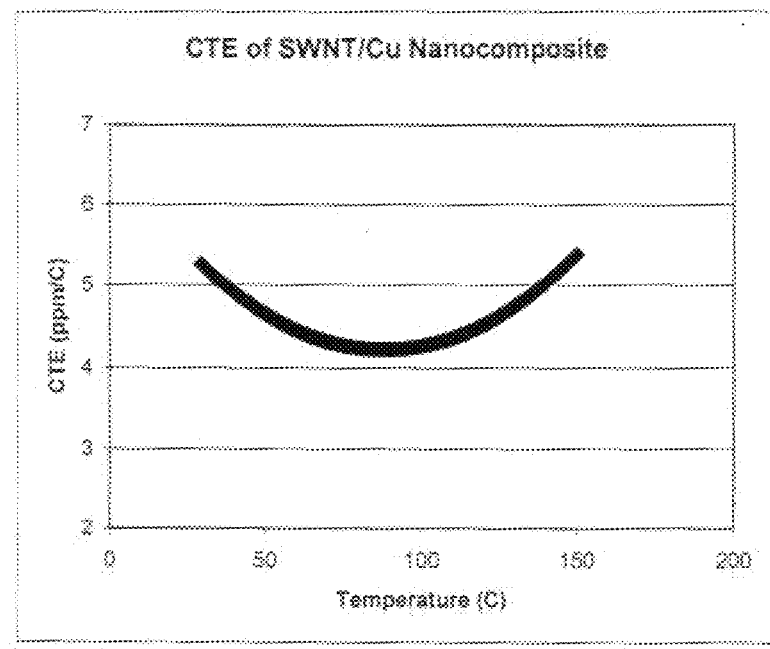
FIG. 6 shows the thermal expansion coefficient (CTE) of a SWNT/Cu nanocomposite according to a disclosed embodiment versus temperature. The CTE for the SWNT/Cu nanocomposite is about 4 times less as compared to pure copper.

Experimental results regarding the effective CTE (in ppm/degree C.) for an exemplary Cu/SWNT (volume portion of SWNT of about 18%) nanocomposite is shown in FIG. 6. The effective CTE is about 4 to $5 \times 10^{-6}$/K in the temperature range of 25 degree C. to 120 degree C. This is about 4 times smaller as compared to the CTE of copper. This effective CTE matches the CTE of most commonly used semiconducting and some insulating (dielectric) substrates.

Figure 7:
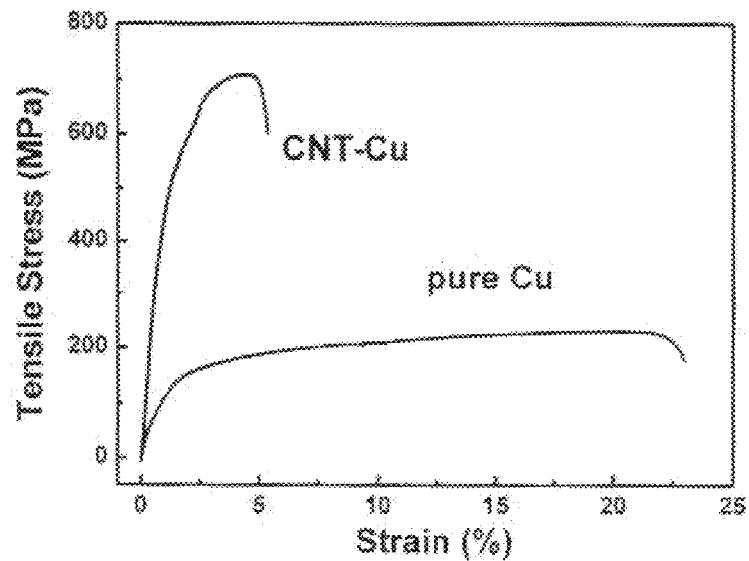
FIG. 7 is plot which compares the tensile strength provided by electrochemical deposition of pure copper as compared to electrochemical-codeposition of CNT reinforced copper composite according to a disclosed embodiment. The tensile strength is shown increased by an order of magnitude by the CNT reinforced copper composite according to a disclosed embodiment.

FIG. 7 is plot which compares the tensile strength provided by electrochemical deposition of pure copper as compared to electrochemical-codeposition of a CNT reinforced copper composite according to a disclosed embodiment. The tensile strength is shown increased by an order of magnitude by the CNT reinforced copper composite disclosed herein.

Figure 8:
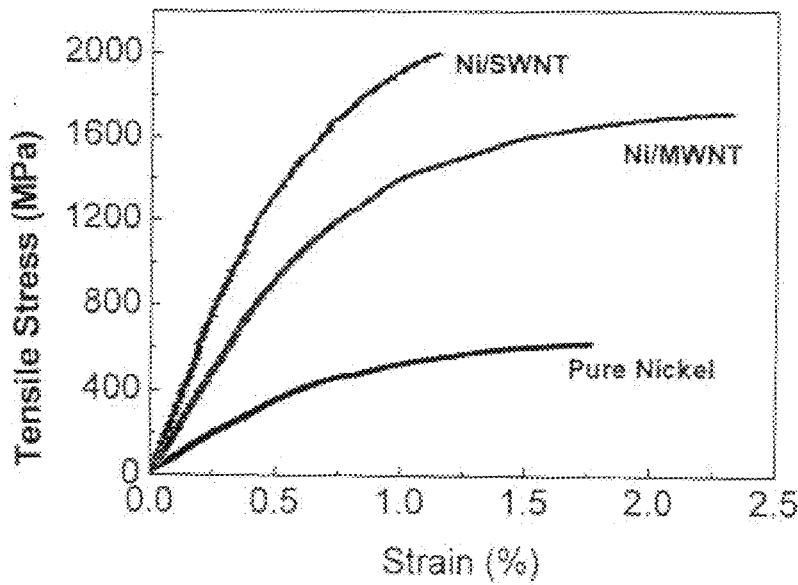
FIG. 8 is plot which compares tensile test results from pure nickel and CNT reinforced composites according to a disclosed embodiment using essentially the same electrochemical-codeposition method described relative to FIG. 7. The multi-walled carbon nanotube (MWNT) reinforced nickel composite increased the strength by more than 270% as compared to that of pure nickel, while the SWNT composite increased the strength by more than 320% as compared to pure nickel.

FIG. 8 is plot which compares tensile test results from pure nickel and CNT reinforced composite fabricated using essentially the same electrochemical-codeposition method described relative to FIG. 7. The MWNT reinforced nickel composite increase the strength by more than 270% that that of pure nickel, while SWNT increased the strength by more than 320% of pure nickel fabricated with similar electrochemical codeposition method.

FIG. 9 is a sectional schematic view of a portion of a semiconducting article 900 having a plurality of metal interconnect layers according to a disclosed embodiment. As known in the art, regarding metal interconnect formation for a non-etchable metal such as copper, a damascene process is used. Once a suitable planar surface is provided, metal interconnect formation can take place. Several substeps are generally involved. The first substep is typically a patterning of the planarized dielectric layer to form a plurality of apertures. If the planarized dielectric is a submetal dielectric, the apertures are contact apertures. If the planarized dielectric is an intermetal dielectric, the apertures are via apertures. Metal is then electrochemically deposited to fill the apertures and cover the dielectric, followed by CMP. The metal in the apertures defines vias or contacts. As shown in FIG. 9, the article 900 is formed upon a silicon substrate 912. The article 900 further includes a field oxide layer 914 deposited over the substrate 912, a first metallization interconnect layer M1 comprising a 1 nanocomposite according to a disclosed embodiment that is electrochemically-codeposited over the field oxide layer. A dielectric layer 916 is deposited over the first metal layer M1, an electrically conductive layer 920 deposited over the dielectric layer 916, an interlevel dielectric material 922 is deposited over layer 920, and a second metal interconnect layer M2 comprising a metal nanocomposite according to a disclosed embodiment is electrochemically-codeposited over the interlevel dielectric material 922.

While various disclosed embodiments have been shown and described, it will be apparent to those skilled in the art that many changes and modifications may be made without departing from this Disclosure in its broader aspects. The appended claims are therefore intended to cover all such changes and modifications as fall within the true spirit and scope of this Disclosure.

The Abstract of this Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

The invention claimed is:

1. An electrochemical-codeposition method for forming a carbon nanotube (CNT) reinforced metal nanocomposite, comprising:

providing a reaction vessel having an anode and a cathode and a plating solution therein, said plating solution comprising at least one acid, at least one surfactant, a plurality of CNTs, and a plurality of metal cations comprising at least one metal, wherein said plurality of CNTs are pre-treated with said surfactant before placement into said plating solution, wherein said plating solution has a pH between 2 and 4.5, and wherein at least a portion of said plurality of CNTs are positively charged CNTs in said plating solution;

connecting a power supply between said anode and cathode, and electrochemical-codepositing both said positively charged CNTs and said metal cations onto said cathode to form said nanocomposite, wherein said metal provides a continuous metal phase for said nanocomposite; and wherein said nanocomposite provides a 25° C. bulk electrical conductivity that is at least 20% greater than a 25° C. bulk electrical conductivity of said metal.

2. The method of claim 1, wherein said pH value during said electro-codeposition process is maintained at a level of 2-4.

3. The method of claim 1, wherein said metal comprises at least one metal selected from the group consisting of copper, cobalt, chromium, tungsten, silver, nickel and gold.

4. The method of claim 3, wherein said metal comprises copper and said 25° C. bulk electrical conductivity is at least 40% greater than said 25° C. bulk electrical conductivity of said copper.

5. The method of claim 4, wherein said nanocomposite provides a coefficient of thermal expansion in the range from 3 to $6 \times 10^{-6}$/K in the temperature range from 25 to 150° C.

6. The method of claim 1, wherein a concentration of said plurality of CNTs in said plating solution is low enough so that said plurality of CNTs are highly dispersed in said plating solution.

7. The method of claim 1, wherein said continuous metal phase extends throughout substantially an entire volume of said nanocomposite.

8. The method of claim 1, wherein said plurality of CNTs comprise at least 95 vol. % single wall nanotubes (SWNTs).

9. The method of claim 1, wherein said plurality of CNTs are uniformly covered by said continuous metal phase.

10. The method of claim 1, wherein a volume fraction of said plurality of CNTs is from 1 to 30% of said nanocomposite.

11. The method of claim 1, wherein said nanocomposite consists of said continuous metal phase and said plurality of CNTs.

12. The method of claim 1, wherein a bulk electrical conductivity and a bulk thermal conductivity of said nanocomposite are both isotropic.

13. An electrochemical-codeposition method for forming a carbon nanotube (CNT) reinforced metal nanocomposite, comprising:

pretreating a plurality of CNTs with at least one surfactant;

providing a reaction vessel having an anode and a cathode and a plating solution therein, said plating solution comprising at least one acid, said surfactant, said plurality of CNTs, and a plurality of metal cations comprising copper, wherein said plating solution has a pH between 2 and 5, and wherein at least a portion of said plurality of CNTs are positively charged CNTs in said plating solution;

connecting a power supply between said anode and cathode, and electrochemical-codepositing both said positively charged CNTs and said metal cations onto said cathode to form said nanocomposite, wherein said copper provides a continuous metal phase for said nanocomposite; and wherein said nanocomposite provides a 25° C. bulk electrical conductivity that is at least 20% greater than a 25° C. bulk electrical conductivity of said copper.

14. The method of claim 13, wherein said nanocomposite provides a 25° C. bulk electrical conductivity that is least 40% greater than said 25° C. bulk electrical conductivity of said copper.

* * * * *